United States Patent [19]

Lee et al.

[11] E Patent Number: Re. 32,200

[45] Reissued Date of Patent: Jul. 8, 1986

[54] MOS BATTERY BACKUP CONTROLLER FOR MICROCOMPUTER RANDOM ACCESS MEMORY

[75] Inventors: Yong K. Lee, Mountain View; Joseph Domitrowich, Half Moon Bay; James S. Gordon, Sunnyvale, all of Calif.

[73] Assignee: Fairchild Semiconductor Corporation, Cupertino, Calif.

[21] Appl. No.: 586,172

[22] Filed: Mar. 5, 1984

Related U.S. Patent Documents

Reissue of:

[64] Patent No.: 4,384,350
Issued: May 17, 1983
Appl. No.: 203,182
Filed: Nov. 3, 1980

[51] Int. Cl.[4] ..... G11C 7/00

[52] U.S. Cl. ..... 365/229; 307/362

[58] Field of Search ..... 365/226, 229; 368/66; 307/355, 362; 340/636, 660, 661, 663

[56] References Cited

U.S. PATENT DOCUMENTS

| | | | |
|---|---|---|---|
| 3,859,638 | 1/1975 | Hume, Jr. | 365/229 |
| 4,099,264 | 7/1978 | Lodi | 365/189 |
| 4,131,942 | 12/1978 | Gillett et al. | 365/228 |
| 4,181,842 | 1/1980 | Elias et al. | 307/66 |
| 4,288,865 | 9/1981 | Graham | 365/229 |

OTHER PUBLICATIONS

Bennett, Raymond N. Electronics (1977), Feb. 3, 1977, p. 109.

*Primary Examiner*—James W. Moffitt
*Attorney, Agent, or Firm*—Stephen J. Phillips; Carl L. Silverman

[57] ABSTRACT

MOS Control circuitry for incorporation on a microcomputer IC chip for assuring adequate power to maintain the data in an associated static random access memory. A rechargeable battery provides standby power, and the voltage level of the battery is compared with the microcomputer $V_{cc}$ supply. Whenever $V_{cc}$ drops below a predetermined level, such as the standby battery voltage level, the circuitry disconnects the $V_{cc}$ from the memory input power and replaces it with standby battery power. When $V_{cc}$ is returned to the system, a gate applies a trickle charge to the battery.

4 Claims, 1 Drawing Figure

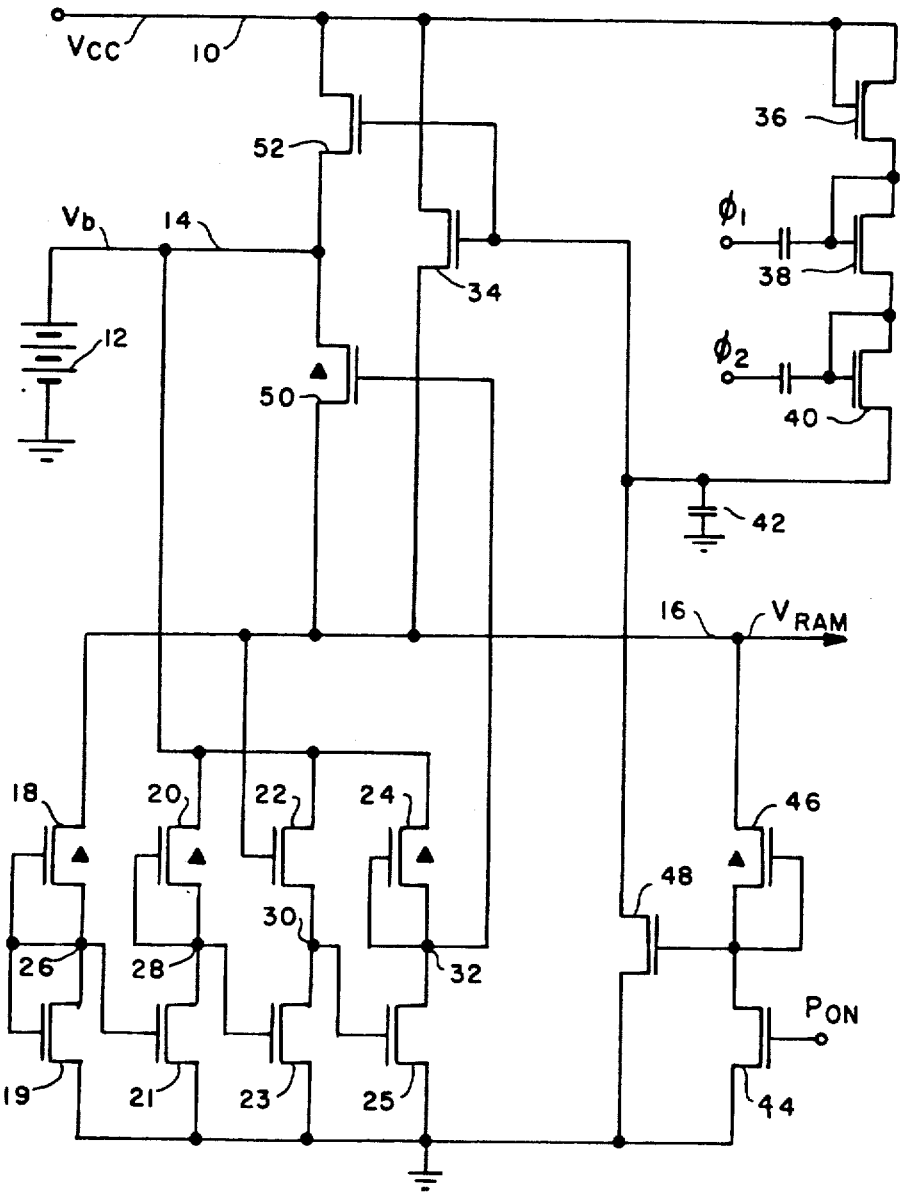
Vcc
10
52
36
Vb
14
34
φ1
38
12
φ2
50
40
42
16
VRAM
18
20
22
24
46
48
30
26
28
32
PON
19
21
23
25
44

MOS BATTERY BACKUP CONTROLLER FOR MICROCOMPUTER RANDOM ACCESS MEMORY

Matter enclosed in heavy brackets [ ] appears in the original patent but forms no part of this reissue specification; matter printed in italics indicates the additions made by reissue.

TECHNICAL FIELD

This invention relates to metal oxide semiconductor (MOS) circuitry and particularly to on-chip MOS circuitry for switching to standby battery power upon loss or reduction of a microcomputer system supply voltage.

BACKGROUND ART

Basic present day microcomputers generally include a microprocessor with input-output ports, a read-only memory (ROM) containing permanent microprocessor operating instructions or programs, and a static random access memory (RAM) for temporary storage of data. All components are usually formed on one integrated circuit chip and operate from one common power source.

Most modern random access memories are fabricated with N-channel silicon gate MOS transistors. They are designed for static operation without the need for complex refreshing circuitry, and therefore require a continuous constant voltage source to maintain the states of the memory latches. The data stored in a static RAM will be lost if power is removed or if the applied voltage is even temporarily reduced to the point where the internal memory latches cannot hold their states.

The circuitry of the present invention prevents the loss of memoryy sustaining power if the regular system power supply fails or falters.

DISCLOSURE OF THE INVENTION

Briefly described, the invention comprises circuitry including an on-chip MOS supply voltage comparator coupled to the system $V_{cc}$ supply conductor and also to an external standby rechargeable battery. The comparator generates a high output whenever the $V_{cc}$ level falls below that of the battery. The comparator output controls the operation of a MOS battery backup controller which includes gates that connect the battery to the RAM voltage conductor while opening switches that disconnect the $V_{cc}$ conductor.

BRIEF DESCRIPTION OF THE DRAWING

The single drawing is a schematic diagram illustrating the backup controller of the invention.

BEST MODE FOR CARRYING OUT THE INVENTION

As illustrated in the drawing, $V_{cc}$ power enters the circuitry on conductor 10 and standby power, $V_b$, preferably supplied by a rechargeable battery 12, enters the circuitry on conductor 14. The standby control circuitry normally applies $V_{cc}$ power to the output conductor 16 which may supply a random access memory. However, if the $V_{cc}$ source fails or the voltage level on the conductor 10 drops below a predetermined level, which may be the voltage level of the battery 12, the control circuitry disconnects the $V_{cc}$ from the output conductor 16 and replaces it with standby power from the battery 12.

The control circuitry includes a MOS supply voltage comparator comprising the eight transistors 18 through 25. it will be noted that transistors 18, 20 and 24 are heavy depletion transistors having the usual relatively high negative threshold and in the circuitry illustrated they are always on. Depletion transistor 18 and the enhancement transistor 19 are coupled in series to form a voltage divider. Transistor 18 is coupled to conductor 16 which, as indicated above, is normally at a $V_{cc}$ level. Transistor 19 is coupled to a ground reference, and the gates of both transistors are coupled together and to their point of source-to-drain interconnection. Transistors 20 and 21 are connected as a conventional MOS inverter circuit. The drain of transistor 20 is coupled to the $V_b$ conductor 14 and the source of transistor 21 is coupled to ground reference. The gate of transistor 20 is coupled to the interconnection of transistors 20 and 21 and the gate of transistor 21 is coupled to the output point at the interconnection of the voltage divider pair 18 and 19.

Transistors 18, 19, 20, and 21 form a current mirror. For a given level of $V_{cc}$ voltage on conductor 16, the voltage divider pair comprising transistors 18 and 19 establish a reference current which is mirrored into the inverter at the gate of transistor 21. If the $V_{cc}$ level on conductor 16 is sufficiently high to provide the required current, then the voltage at the inverter output point 28 is lower than the divider output voltage at interconnecting point 26. If, on the other hand, the $V_b$ level on conductor 14 is higher than the $V_{cc}$ level on conductor 16, then the voltage at point 28 is greater than that at point 26.

The output point 28 of the inverter including transistors 20 and 21 is applied to a buffer circuit comprising transistors 22 and 23 in series. The drain of transistor 22 is connected to the $V_b$ conductor 14 and the source of transistor 23 is connected to ground reference. The gate of transistor 22 is connected to the conductor 16 and the gate of transistor 23 is connected to the output point 28 of the inverter. Thus, if the output 28 is at a high level, transistor 23 is conductive and its output point 30 at the connection of transistors 22 and 23 is low. A signal output may be taken at this point 30; however, in the circuitry described herein, the positive high output is desired whenever the $V_{cc}$ level on conductor 10 drops below a predetermined level. Therefore, the output signal at point 30 of the buffer is inverted by a second inverter comprising transistors 24 and 25 in series. This inverter output taken from the interconnecting point 32 provides the required signals from the gating circuit to be described.

The switchover point between the $V_{cc}$ and $V_b$ will normally occur when $V_{cc}$ is equal to $V_b$ and the voltage at inverter output 28 equals the voltage at the divider output 26. This switch point will occur if the enhancement transistors 19 and 21 are identical. If desired, the switch point may be altered by appropriately changing the physical sizes of the MOS transistors in the circuitry so that the supply switchover points may occur at different levels of $V_{cc}$.

As previously mentioned, $V_{cc}$ power from conductor 10 is normally applied, during operation, to the output conductor 16 through a switching transistor 34, the gate of which is connected to the output of a conventional charge pump comprising transistors 36, 38 and 40 in series. Both the gate and the drain elements of transistor 36 are connected to the $V_{cc}$ conductor 10 and the gates of the transistors 38 and 40 are connected to their drain elements. The gates of transistors 38 and 40 are also coupled through capacitors to a two-phase microcomputer clock which operates to pump the charge pump output to a level that is more positive than the $V_{cc}$ level. This higher voltage is filtered by a suitable capacitor 42 and applied to the gate of the transistor 34 to turn on this transistor to provide conduction between the $V_{cc}$ conductor 10 and the output conductor 16. It will be noted that any failure in the microcomputer clock circuitry, as well as the $V_{cc}$ level, will result in a drop of the gate voltage on the transistor 34 with the consequent disconnecting of the $V_{cc}$ from the output conductor 16.

When $V_{cc}$ power to the microcomputer is turned off, the level of $V_{cc}$ on the conductor 10 will decay and the two-phase clock input to the charge pump will be removed. The signal which is indicating that the microcomputer power is on or off is applied to the gate of a transistor 44 that is coupled to ground reference and is in series with a heavy depletion load transistor 46 coupled to the output conductor 16. The gate of the heavy depletion transistor 46 is coupled to the interconnection between transistors 44 and 46 and the transistor 46 is always on. A high "on" signal applied to the gate of transistor 44 renders that transistor conductive and results in a low input signal on the gate of transistor 48, which is connected between ground reference and the output of the charge pump. When microcomputer power is turned off, a low signal is applied to the gate of the transistor 44 to render it non-conductive so that the gate of transistor 48 goes to its high level to render transistor 48 conductive. Therefore, even before the $V_{cc}$ level has begun to decay as a result of power turn-off, the charge pump output conductor is grounded to discharge the capacitor 42 and to turn off the main switching transistor 34 between the $V_{cc}$ conductor 10 and the output conductor 16.

The $V_b$ conductor 14 is coupled to the circuitry output conductor 16 through a heavy depletion transistor 50, the gate of which is connected to the output point 32 of the voltage comparator circuitry. Thus, when the voltage comparator generates a high output resulting from the lowering of the $V_{cc}$ level, transistor 50 is fully turned on to provide a current path between the external battery 12 and the circuitry output conductor 16. The output conductor 16 is therefore maintained at a proper voltage, either by the $V_{cc}$ power or by the $V_b$ power so that the random access memory being supplied with the output voltage on conductor 16 will retain the data contained therein.

Upon return of $V_{cc}$ to its normal level, the output on the charge pump will again render the switching transistor 34 conductive and the output of the comparator will remove the standby power from the output conductor. The output of the charge pump is also connected to the gate of a transistor 52 which is connected between the $V_{cc}$ conductor 10 and the $V_b$ conductor 14. When transistor 52 is turned on by the operation of the charge pump, current from conductor 10 is applied through the conductor 14 and into the external rechargeable standby battery 12 to thereby maintain the charge on the battery in readiness for future use.

We claim:

[1. In a MOS microcomputer circuit, a voltage comparator coupled to a $V_{cc}$ conductor and to a source of standby power for generating an output signal when the $V_{cc}$ level drops below a predetermined voltage level of said standby power, said comparator comprising:

a voltage divider including first and second MOS transistors coupled in series between the $V_{cc}$ conductor and ground reference, the gates of said transistors being coupled together and to the interconnection of said first and second transistors;

an inverter circuit including third and fourth MOS transistors coupled in series, said third transistor being coupled to said standby source and said fourth transistor being coupled to ground reference, the gate of said third transistor being coupled to the interconnection of said third and fourth transistors and the gate of said fourth transistor being coupled to the interconnection of said first and second transistors; and a buffer circuit including fifth and sixth series MOS transistors, said fifth transistor being coupled to said standby source and said sixth transistor being coupled to ground reference, the gate of said fifth transistor being coupled to $V_{cc}$ and the gate of said sixth transistor being coupled to the interconnection of said third and fourth transistors, the output of said buffer circuit being at the intersection of said fifth and sixth series transistors.]

[2. The voltage comparator claimed in claim 1 further including a second inverter circuit including seventh and eighth series MOS transistors, said seventh transistor being coupled to said standby source and said eighth transistor coupled to said ground reference, the gate of said eighth transistor being coupled to the interconnection of said sixth and seventh transistors and the output of said second inverter circuit being at the interconnection of said seventh and eighth transistors.]

[3. The comparator claimed in claim 2 wherein said first, third and seventh transistors are heavy depletion load transistors.]

4. MOS microcomputer system computer control circuitry for maintaining memory sustaining voltage to a static random access memory upon failure of the system to maintain a $V_{cc}$ level, said control circuitry comprising:

(a) input means for connecting an external battery to said control circuitry;

(b) a MOS voltage comparator coupled to said input means and to a $V_{cc}$ conductor, said comparator generating an output signal when the $V_{cc}$ level drops by a predetermined amount wherein said voltage comparator comprising:

(i) a voltage divider including first and second MOS transistor coupled in series between the $V_{cc}$ conductor and ground reference, the gates of said first and second transistors being coupled together and to the interconnection of said first and second transistors;

(ii) an inverter circuit including third and fourth MOS transistors coupled in series, said third transistor being coupled to said input means and said fourth transistor being coupled to ground reference, the gate of said third transistor being coupled to the interconnection of said third and fourth transistors and the gate of said fourth transistor being coupled to the interconnection of said first and second transistors;

(iii) a buffer circuit including fifth and sixth series MOS transistor, said fifth transistor being coupled to said input means and said sixth transistor being coupled to ground reference, the gate of said fifth transistor being coupled to $V_{cc}$ and the gate of said sixth transistor being coupled to the interconnection of said third and fourth transistors, the output of said buffer circuit being at the interconnection of said fifth and sixth series transistors; and (iv) a second inverter circuit including seventh and eighth series MOS transistors, said seventh transistor coupled to said input means and said eighth transistor coupled to said ground reference, the gate of said eighth transistor being coupled to the interconnection of said sixth and seventh transistors, the interconnection between said seventh and eighth transistors providing the output of said second inverter circuit to said MOS gating circuitry; and (c) MOS gating circuitry coupled to said input means, to said $v_{cc}$ conductor, and to the output conductor and responsive to the output signal of said comparator for coupling said $V_{cc}$ conductor to said output conductor when the voltage level on said $V_{cc}$ conductor remains at least as high as the voltage level of said input means, and for disconnecting the coupling to said $V_{cc}$ conductor and coupling said input means to said output conductor upon a lowering of said $V_{cc}$ by a predetermined amount.

5. The control circuitry claimed in claim 4 wherein said gating circuitry includes a MOS charge pump coupled to said $V_{cc}$ conductor and to a two-phase clock source, said charge pump generating an output voltage more positive than said $V_{cc}$ level for turning on MOS gates coupled between said $V_{cc}$ conductor and said output conductor.

6. The control circuitry claimed in claim 5 wherein said MOS gating circuitry provides a battery charging current from said $V_{cc}$ to said input means.

7. The control circuitry claimed in claim 6 further including switch means responsive to a signal indicative of the existence of input power, said switch means coupled between the output of said charge pump and ground reference for grounding said output upon the removal of said input power.

* * * * *